United States Patent [19]
Yamaguchi et al.

[11] Patent Number: 5,275,694
[45] Date of Patent: Jan. 4, 1994

[54] PROCESS FOR PRODUCTION OF COPPER THROUGH-HOLE PRINTED WIRING BOARDS

[75] Inventors: Hideaki Yamaguchi, Okegawa; Hideyuki Kawai, Chichibu; Daikichi Tachibana, Tokyo; Kenichi Yamaguchi, Konosu, all of Japan

[73] Assignee: Sanwa Laboratory Ltd., Tokyo, Japan

[21] Appl. No.: 855,258

[22] Filed: Mar. 23, 1992

[51] Int. Cl.$^5$ .............................. B44C 1/22; C23F 1/00
[52] U.S. Cl. .................................... 156/656; 156/634; 156/645; 156/661.1; 156/902; 156/904
[58] Field of Search ............... 156/630, 634, 644, 645, 156/656, 659.1, 666, 902, 904, 661.1; 29/846, 852; 427/96, 97; 252/79.5

[56] References Cited

U.S. PATENT DOCUMENTS 4,622,097 11/1986 Tsukagoshi .................... 156/644
4,983,252 1/1991 Masui et al. .................... 156/630

FOREIGN PATENT DOCUMENTS 0178864 4/1986 European Pat. Off.
63-005591 1/1988 Japan .
63-027091 2/1988 Japan .
63-142892 6/1988 Japan .
3-235395 10/1991 Japan .
4-051592 2/1992 Japan .

*Primary Examiner*—William A. Powell
*Attorney, Agent, or Firm*—Leydig, Voit & Mayer

[57] ABSTRACT

Copper through-hole printed wiring boards are produced by forming an etching resist layer on the copper plating of a double sided copper clad laminate. The etching resist layer is formed after a negative resist pattern is applied to both sides of the laminate, and the laminate then dipped in a solution containing at least one salt of 2-alkylbenzimidazoles, 2-alkylalkylbenzimidazoles, 2-phenyl-benzimidazoles and 2-phenylalkylbenzimidazoles. After the resulting etching resist layer is selectively removed with an alkaline aqueous solution, in accordance with the predetermined pattern of the wiring, the exposed copper plating is etched off with an alkali etchant. According to the process of the present invention, remarkable advantages such as increased productivity, lower production costs, reduced toxic substances in waste water, and a high reliability can be obtained in the production of copper through-hole printed wiring boards.

11 Claims, No Drawings

PROCESS FOR PRODUCTION OF COPPER THROUGH-HOLE PRINTED WIRING BOARDS

BACKGROUND OF THE INVENTION

1. Field of the Invention

The present invention relates to a process for the production of printed wiring boards with copper through-holes, i.e., copper through-hole printed wiring boards. According to the present process, the printed wiring boards can be produced in a shorter production time, and at a lower production cost, with a greatly increased reliability.

2. Description of the Related Art

In copper through-hole printed wiring boards, all circuits including through-holes are formed from copper, and thus have advantages such as a good adhesion of the solder resist thereto and a complete removal of the etching resist from the circuit area. These printed wiring boards are typically produced in accordance with the following three methods:

(1) hole-filling method;
(2) tenting method; and
(3) solder separation method.

The hole-filling method comprises drilling a necessary numbers of holes in a predetermined portion of the double-sided copper clad laminate, and subjecting the holes-bearing laminate to a sequential chemical copper plating and copper electroplating. After the electroplating is completed, all of the holes are filled with a sealing ink, to protect an inner wall of the each through-hole from the introduction of an etchant in the subsequent etching step. Thereafter, positive resist patterns corresponding to the necessary circuit patterns are applied to both sides of the laminate, by a printing process or photographic process, and then an etching is carried out, using the resist patterns as a mask, to remove the copper exposed by the resist pattern. Finally, the resist patterns and the sealing ink in the holes are removed, to obtain the intended copper through-hole printed wiring boards.

The tenting method is characterized by using a dry resist film in place of the sealing ink of the above hole-filling method. Namely, after the completion of drilling, chemical copper plating and copper electroplating, dry resist films are applied to both sides of the laminate, and the holes are covered with these films. The resist films are patternwise exposed and developed, followed by etching using the remaining resist films as a mask, to remove the exposed copper. Note, an inner wall (copper plating) of the through-holes is protected by the upper and lower resist films. The copper through-hole printed wiring boards are obtained after removal of the remaining resist films.

The solder separation method is distinguished from the above-described methods in that it utilizes negative patterns of a plating resist for a solder electroplating (the resist is not etched). A sealing ink is not required in this method. After the drilling, chemical copper plating and copper electroplating are completed as in the above two methods, negative patterns of the plating resist are applied to the copper clad laminate by a printing or photographic process. Then, using the negative resist patterns as a mask, a solder electroplating is carried out to deposit the solder on the exposed copper surfaces. Thereafter, the resist patterns used as the mask and the exposed copper plating not having a deposit of solder thereon are removed, to obtain the copper through-hole printed wiring boards.

The above-discussed prior art methods, however, have several drawbacks. For example, because of a poor reliability of the etching resist layer used, defective products are frequently produced, and although the production efficiency is accordingly not high, the production cost is remarkably high. Particularly, these methods can not satisfy recent requirements that a large amount of products must be provided with a shorter delivery time and at a lower cost. Further, in the solder separation method, due to the use of hydrofluoric acid and lead used in the processing steps thereof, a problem of environmental pollution can not be avoided, and accordingly, the expense of preventing environmental pollution is remarkably increased.

SUMMARY OF THE INVENTION

An object of the present invention is to provide a novel process for the production of printed wiring boards having copper through-holes therein, this production process ensuring the production of wiring boards with a high reliability equivalent to or higher than that of the solder separation method, being simple and being completed within a short processing time. Further, in view of the prevention of environmental pollution, the treatment of the waste water is also, simple, and furthermore, the cost of producing these wiring boards is low in comparison with the prior art methods.

According to the present invention, there is provided a process for the production of printed wiring boards with copper through-holes, which process comprises the steps of:

forming a negative pattern of the alkaline aqueous solution-soluble resist on both sides of a cooper clad laminate having through-holes previously drilled therein, in accordance with a printing process or photographic process;

dipping the resist pattern-bearing copper clad laminate in a both of solution providing an etching resist layer and containing at least one salt of the compound represented by the following formula (I):

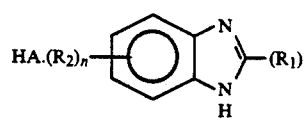
(I)

wherein
$R_1$ represents an alkyl group of 3 to 17 carbon atoms,
$R_2$ represent a lower alkyl group, preferably an alkyl group of 1 to 6 carbon atoms,
n is an integer of 0 to 3, and
HA represents an organic or inorganic acid, and

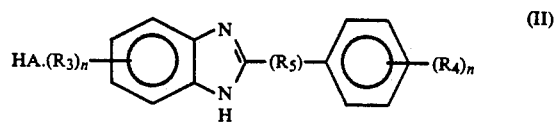
(II)

where
$R_1$ is an alkyl group having 3 to 17 carbon atoms, or an aryl group of the formula

$R_2$ is an alkyl group having 1 to 6 carbon atoms,
$R_3$ is an alkyl group having 1 to 7 carbon atoms,
$R_4$ is an alkyl group having 1 to 6 carbon atoms,
n is an integer of 0 to 3
x is 0 or 1, and
HA is an organic or inorganic acid,
to thereby coat a surface of the copper plating of the laminate with an etching resist layer consisting of a copper complex of the benzimidazole compound of the formula (I);

drying the etching resist layer of the laminate;

bringing the laminate into contact with an alkaline aqueous solution, to thereby selectively remove the etching resist layer, and expose the copper plating in non-circuit areas of the laminate; and treating the laminate with an alkaline etchant to etch the exposed copper plating from the laminate.

Note, in the compound of the formula (I), if $R_1$ is an aryl group of the formula

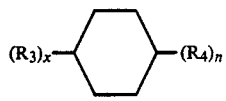

and x is 0; the compound is represented by the formula:

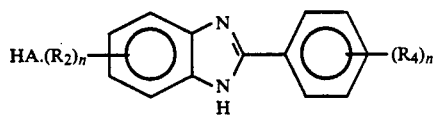

According to the present invention, there is also provided a modification of the above production process, further comprising the step of dipping the copper clad laminate in a buffer solution containing copper ions, after the formation of the etching resist layer and before the selective removal of same.

DESCRIPTION OF THE PREFERRED EMBODIMENTS

The inventors made a thorough investigation of many kinds of substances, to find a novel method of producing the above-described printed wiring boards and a substance useful to such a method, and as a result, found that 2-alkyl-benzimidazoles, 2-alkylalkylbenzimidazoles, 2-phenylbenzimidazoles and 2-phenylalkylbenzimidazoles, i.e., the compounds represented by the above formula (I), are useful if used as an active component in a solution providing an etching resist layer in the described method. These benzimidazole compounds, if compared with solder, are more stable and are cheaper, and further can be more easily removed, when necessary, from the copper clad laminate. Further, since these compounds have an excellent resistance to etching, they can protect the copper plating portion of the laminate during the alkaline etching step. Furthermore, as these compounds have a good reactivity with copper, they can selectively deposit an etching resist layer only on the copper surface of the laminate.

Typical examples of the benzimidazole compounds useful in the process of the present invention include:

BI-1 2-n-propylbenzimidazole,
BI-2 2-n-propylmethylbenzimidazole,
BI-3 2-n-propyldimethylbenzimidazole,
BI-4 2-n-butylbenzimidazole,
BI-5 2-n-butylmethylbenzimidazole,
BI-6 2-n-butyldimethylbenzimidazole,
BI-7 2-n-pentylbenzimidazole,
BI-8 2-n-pentylmethylbenzimidazole,
BI-9 2-n-pentyldimethylbenzimidazole,
BI-10 2-n-hexylbenzimidazole,
BI-11 2-n-hexylmethylbenzimidazole
BI-12 2-n-hexyldimethylbenzimidazole,
BI-13 2-n-heptylbenzimidazole,
BI-14 2-n-heptylmethylbenzimidazole,
BI-15 2-n-heptyldimethylbenzimidazole,
BI-16 2-n-octylbenzimidazole,
BI-17 2-n-octylmethylbenzimidazole
BI-18 2-n-octyldimethylbenzimidazole,
BI-19 2-n-nonylbenzimidazole,
BI-20 2-n-nonylmethylbenzimidazole,
BI-21 2-n-nonyldimethylbenzimidazole,
BI-22 2-n-decylbenzimidazole,
BI-23 2-n-decylmethylbenzimidazole
BI-24 2-n-decyldimethylbenzimidazole,
BI-25 2-n-undecylbenzimidazole,
BI-26 2-n-undecylmethylbenzimidazole,
BI-27 2-n-undecyldimethylbenzimidazole,
BI-28 2-n-dodecylbenzimidazole,
BI-29 2-n-dodecylmethylbenzimidazole
BI-30 2-n-dodecyldimethylbenzimidazole,
BI-31 2-n-tridecylbenzimidazole,
BI-32 2-n-tridecylmethylbenzimidazole,
BI-33 2-n-tridecyldimethylbenzimidazole,
BI-34 2-n-tetradecylbenzimidazole,
BI-35 2-n-tetradecylmethylbenzimidazole,
BI-36 2-n-tetradecyldimethylbenzimidazole,
BI-37 2-n-pentadecylbenzimidazole,
BI-38 2-n-pentadecylmethylbenzimidazole
BI-39 2-n-pentadecyldimethylbenzimidazole,
BI-40 2-n-hexadecylbenzimidazole,
BI-41 2-n-hexadecylmethylbenzimidazole,
BI-42 2-n-hexadecyldimethylbenzimidazole,
BI-43 2-n-heptadecylbenzimidazole,
BI-44 2-n-heptadecylmethylbenzimidazole,
BI-45 2-n-heptadecyldimethylbenzimidazole,
BI-46 2-isopropylbenzimidazole,
BI-47 2-isopropylmethylbenzimidazole,
BI-48 2-isopropyldimethylbenzimidazole,
BI-49 2-isobutylbenzimidazole,
BI-50 2-isobutylmethylbenzimidazole
BI-51 2-isobutyldimethylbenzimidazole,
BI-52 2-isopentylbenzimidazole,
BI-53 2-isopentylmethylbenzimidazole,
BI-54 2-isopentyldimethylbenzimidazole,
BI-55 2-isohexylbenzimidazole,
BI-56 2-isohexylmethylbenzimidazole,
BI-57 2-isohexyldimethylbenzimidazole,
BI-58 2-neopentylbenzimidazole,
BI-59 2-neopentylmethylbenzimidazole,
BI-60 2-neopentyldimethylbenzimidazole,
BI-61 2-sec.-butylbenzimidazole,
BI-62 2-sec.-butylmethylbenzimidazole
BI-63 2-sec.-butyldimethylbenzimidazole,
BI-64 2-tert.-butylbenzimidazole, BI-65 2-tert.-butylmethylbenzimidazole,
BI-66 2-tert.-butyldimethylbenzimidazole,
BI-67 2-phenylbenzimidazole,
BI-68 2-phenylmethylbenzimidazole,
BI-69 2-phenyldimethylbenzimidazole,
BI-70 2-tosylbenzimidazole,
BI-71 2-tosylmethylbenzimidazole,
BI-72 2-tosyldimethylbenzimidazole,
BI-73 2-xylylbenzimidazole,
BI-74 2-xylylmethylbenzimidazole
BI-75 2-xylyldimethylbenzimidazole,
BI-76 2-mesitylbenzimidazole,
BI-77 2-mesitylmethylbenzimidazole,
BI-78 2-mesityldimethylbenzimidazole,
BI-79 2-tert.-phenylbenzimidazole,
BI-80 2-tert.-phenylmethylbenzimidazole,
BI-81 2-tert.-phenyldimethylbenzimidazole,
BI-82 2-(1-phenylmethyl)benzimidazole,
BI-83 2-(3-phenylpropyl)benzimidazole,
BI-84 2-(7-phenylheptyl)benzimidazole,
BI-85 2-(2-phenylethyl)methylimidazole,
BI-86 2-(2-tolylethyl)benzimidazole, and
BI-87 2-(2-tolylethyl)methylimidazole.

In the practice of the present invention, these benzimidazole compounds may be used alone or as a mixture of two or more compounds. As mentioned above, if required, these compounds may be used in the form of derivatives thereof. Further, in the solution providing an etching resist layer, these compounds are used as a salt of any organic or inorganic acid. Typical examples of suitable acids include acetic acid, formic acid, capric acid, glycolic acid, para-nitrobenzoic acid, para-toluene sulfonic acid, picric acid, oxalic acid, succinic acid, phosphorous acid, maleic acid, acrylic acid, fumaric acid, tartaric acid, adipic acid, hydrochloric acid, sulfuric acid, phosphoric acid, lactic acid, oleic acid and the like.

Furthermore, the solution providing an etching resist layer may contain an optional amount of metal compounds such as copper (II) acetate, copper (II) sulfate, cuprous chloride, cupric chloride, copper hydroxide, cuprous oxide, cupric oxide, copper (II) phosphate and copper (II) carbonate, and water-soluble solvents such as methanol, ethanol, isopropyl alcohol, butanol and acetone. The preparation of the etching resist layer-providing solution will be described hereinafter.

The production process of the present invention may be carried out in accordance with the following processing sequence, but any additional and conventional steps may be added if necessary.

(1) Formation of negative resist pattern on copper clad laminate
(2) Dipping laminate in solution providing etching resist layer
(3) Drying etching resist layer
(4) Selective removal of etching resist layer
(5) Etching of copper plating Further, the buffer treatment step may be introduced between the steps (2) and (3).

As a first step of the present step, a negative pattern of the alkaline aqueous solution-soluble resist is applied to both sides of a copper clad laminate, in accordance with a printing process such as screen printing or photographic process. A conventional copper clad laminate is used herein, which comprises a substrate having a copper foil applied to the upper and lower surfaces thereof. The laminate includes both rigid and flexible boards. Also, the copper clad laminate used has a predetermined number of through holes, and an inner surface of each through-hole also has a copper foil provided thereon. The copper foil or plating is generally produced by a chemical copper plating and copper electroplating. Note, before the formation of the resist pattern, the copper plating of the double sided copper clad laminate is treated and surface-finished, to thus improve the surface properties thereof, and such a treatment and finishing process includes, for example, soft etching, polishing, swabbing, liquid honing, degreasing and water washing.

Preferably, a negative pattern of the alkaline aqueous solution-soluble resist is formed, for example, from a resist ink, alkali-developable liquid resist and alkali-developable photosensitive film or dry film resist. Either the printing process or photographic process is selected, depending on the type of resist used.

After the formation of the negative resist pattern, the resist pattern-bearing copper clad laminate is dipped in the etching resist layer-providing solution containing at least one salt of the above-described benzimidazole compounds. Preferably, the dipping solution used contains the benzimidazole compound, i.e. 2-alkylbenzimidazole, 2-alkylalkylbenzimidazole, 2-phenylbenzimidazole or 2-phenylalkylbenzimidazole, in an amount of 0.01 to 40%, more preferably 0.1 to 5%, with regard to the total amount of the solution. Preferably, dipping is carried out at a temperature of 0° to 100° C., more preferably 30° to 50° C. The dipping time can be widely varied within a few seconds through several tens of minutes; for example, a dipping time of 1 to 3 minutes is suitable at a temperature of 40° to 50° C. Also, preferably the dipping solution has a pH value on the acidic side, more preferably has a pH value of 5.0 or less. Note, the amount of resist layer deposited on the copper plating can be increased with an increase of the dipping temperature and extension of the dipping time.

The thus-obtained etching resist layer is then dried. The drying can be carried out by any conventional means, such as a drying oven.

Further, according to another aspect of the present invention, the etching resist layer may be treated with a copper ion-containing buffer solution. Preferably, the etching resist layer-bearing laminate is dipped in the buffer solution. A suitable buffer solution can be prepared by mixing one or more bases, such as ammonia, diethylamine, triethylamine, diethanolamine, triethanolamine, monoethanolamine, dimethylethanolamine, diethylethanolamine, isopropylethanolamine, sodium hydroxide and potassium hydroxide, and one or more copper compounds, such as copper (II) acetate, copper (II) sulfate, cuprous chloride, cupric chloride, copper hydroxide, copper oxide, cuprous oxide, cupric oxide, copper (II) phosphate and copper (I) carbonate. Preferably, the concentration of the copper ion in the buffer solution is several parts per million (ppm) or more, more preferably 50 to 150 ppm, and a pH value of the buffer solution is preferably from 6.5 to 4.5. Dipping is carried out at a temperature of 0° to 100° C., preferably 30° to 50° C. The dipping time can be varied in the range of from a few seconds to several tens of minutes, but preferably a dipping time of 1 to 3 minutes is used.

After the drying is completed, the etching resist layer is selectively removed to expose the copper plating in non-circuit areas of the laminate. The selective removal of the etching resist layer is preferably carried out by bringing the laminate into contact with an alkaline aqueous solution, and more preferably, dipping and spraying are utilized in this treatment. An alkali etching follows the selective removal of the etching resist layer, to thereby etch the exposed copper plating (unnecessary portion) from the laminate. In this treatment, any alkaline etchant well-known in alkaline etching systems can be used, in a conventional manner. The intended copper through-hole printed wiring boards can be thusobtained after the used resist layer as the mask has been removed.

The detailed mechanism of the present process has not yet been clarified, but it is based on the findings that the described 2-alkylbenzimidazoles, 2-alkylalkylbenzimidazoles, 2-phenylbenzimidazoles and 2-phenylalkylbenzimidazoles each has a film-forming capability, and accordingly, the layer formed from these benzimidazole compounds can be industrially utilized as a chemically stable, etching-resistant resist layer.

Further, the benzimidazole compounds can chemically react with copper of the copper plating, to thereby form a stable chelate monomolecular film. The chelate monomolecular film can gradually increase its film thickness, with time. Moreover, because of the van der Waals force of the adjacent alkyl groups thereof, the benzimidazole compounds are deposited on the copper plating, to thereby form a net-like layer. Note, if the above-described buffer treatment is carried out after the formation of the benzimidazole layer, the copper ions in the buffer solution migrate into the benzimidazole layer and as a result, a stability of the layer, i.e., chelate monomolecular film, can be remarkably improved, and accordingly, the physical strength of the layer can be significantly increased.

The present invention will be further described with reference to working examples thereof.

EXAMPLES 1 AND 2

Double sided copper clad laminate FR-4 having a thickness of 1.6 mm was drilled to bore a predetermined number of through-holes therein. Chemical copper plating and copper electroplating were subsequentially carried out to deposit a copper plating of 25 to 30 $\mu$m thickness onto an inner surface of each through-hole and both sides of the laminate. After formation of copper plating, a negative pattern of the resist was coated over the copper plating of the laminate in accordance with a printing process (Example 1) and photographic process (Example 2).

For Example 1, a resist ink containing acrylic acid and styrene copolymer as principal components thereof (trade name "KM-10" commercially available from Taiyo Ink Seizo KK) was printed over the copper plating of the laminate on a screen printing machine. The resulting negative pattern of the resist having a thickness of about 20 $\mu$m was then dried at 80° C. for 10 minutes.

For Example 2, a photosensitive dry film resist (trade name "A-255" commercially available from Fuji Hunt Co.) was superposed over the copper plating of the laminate, and then photographically exposed and developed. The resulting negative pattern of the resist having a thickness of 25 $\mu$m was then dried as in Example 1.

The resist pattern-bearing copper clad laminate was dipped in a 20% aqueous solution of sodium persulfate (persulfate etchant) to soft-etch a surface of the copper plating. After soft etching, the copper clad laminate was dipped in a 1% solution of benzimidazole compound, listed in the following Table 1, containing 0.5 g/l of cupric chloride in addition to formic acid and ammonia, and treated at 50° C. for 3 minutes with gentle movement of the laminate. After the benzimidazole treatment has completed, the copper clad laminate was washed with water, and then dried at 140° C. for 10 minutes. The etching resist layer was thus obtained.

After formation of the etching resist layer, the resist layer-bearing laminate was treated with a 3% aqueous solution of sodium hydroxide to selectively remove the resist layer in non-circuit areas. As a result, the copper plating in the non-circuit areas of the laminate was fully exposed.

The copper clad laminate was etched with a alkali etchant (trade name "A process" commercially available from Mertec Co.) by guiding the laminate through a spray of the etchant at 50° C. for 120 seconds. The exposed copper plating was completely etched off. The laminate was dipped in a 5% aqueous solution of hydrochloric acid to remove the etching resist layer used as the masking means in the previous etching step. The copper through-hole printed wiring board was thus obtained. The wiring board was evaluated with regard to a finishing state thereof, and the results of the evaluation is summarized in the following Table 1.

EXAMPLES 3 AND 4

Double sided copper clad laminate FR-4 having a thickness of 1.6 mm was drilled to bore a predetermined number of through-holes therein. Chemical copper plating and copper electroplating were subsequentially carried out to deposit a copper plating of 25 to 30 $\mu$m thickness onto an inner surface of each through-hole and both sides of the laminate. After formation of copper plating, a negative pattern of the resist was coated over the copper plating of the laminate in accordance with a printing process (Example 3) and photographic process (Example 4).

For Example 3, a resist ink containing acrylic acid and styrene copolymer as principal components thereof (trade name "KM-10" commercially available from Taiyo Ink Seizo KK) was printed over the copper plating of the laminate on a screen printing machine. The resulting negative pattern of the resist having a thickness of about 20 $\mu$m was then dried at 80° C. for 10 minutes.

For Example 4, a photosensitive dry film resist (trade name "A-225" commercially available from Fuji Hunt Co.) was superposed over the copper plating of the laminate, and then photographically exposed and developed. The resulting negative pattern of the resist having a thickness of 25 $\mu$m was then dried as in Example 3.

The resist pattern-bearing copper clad laminate was dipped in a 20% aqueous solution of sodium persulfate (persulfate etchant) to soft-etch a surface of the copper plating. After soft etching, the copper clad laminate was dipped in a 1% solution of benzimidazole compound, listed in the following Table 2, containing 0.5 g/l of cupric chloride in addition to formic acid and ammonia, and treated at 50° C. for 3 minutes with gentle movement of the laminate. After the benzimidazole treatment has completed, the copper clad laminate was washed with water, and then dried at 140° C. for 10 minutes. The etching resist layer was thus obtained.

After formation of the etching resist layer, the resist layer-bearing laminate was treated with a 3% aqueous solution of sodium hydroxide to selectively remove the resist layer in non-circuit areas. As a result, the copper plating in the non-circuit areas of the laminate was fully exposed.

The copper clad laminate was etched with a alkali etchant (trade name "A process" commercially available from Mertec Co.) by guiding the laminate through a spray of the etchant at 50° C. for 120 seconds. The exposed copper plating was completely etched off. The laminate was dipped in a 5% aqueous solution of hydrochloric acid to remove the etching resist layer used as the masking means in the previous etching step. The copper through-hole printed wiring board was thus obtained. The wiring board was evaluated with regard to a finishing state thereof, and the results of the evaluation is summarized in the following Table 2.

EXAMPLES 5 AND 6

Double sided copper clad laminate FR-4 having a thickness of 1.6 mm was drilled to bore a predetermined number of through-holes therein. Chemical copper plating and copper electroplating were subsequentially carried out to deposit a copper plating of 25 to 30 μm thickness onto an inner surface of each through-hole and both sides of the laminate. After formation of copper plating, a negative pattern of the resist was coated over the copper plating of the laminate in accordance with a printing process (Example 5) and photographic process (Example 6).

For Example 5, a resist ink containing acrylic acid and styrene copolymer as principal components thereof (trade name "KM-10" commercially available from Taiyo Ink Seizo KK) was printed over the copper plating of the laminate on a screen printing machine. The resulting negative pattern of the resist having a thickness of about 20 μm was then dried at 80° C. for 10 minutes.

For Example 6, a photosensitive dry film resist (trade name "A-225" commercially available from Fuji Hunt Co.) was superposed over the copper plating of the laminate, and then photographically exposed and developed. The resulting negative pattern of the resist having a thickness of 25 μm was then dried as in Example 5.

The resist pattern-bearing copper clad laminate was dipped in a 20% aqueous solution of sodium persulfate (persulfate etchant) to soft-etch a surface of the copper plating. After soft etching, the copper clad laminate was dipped in a 1% solution of benzimidazole compound, listed in the following Table 1, containing 0.5 g/l of cupric chloride in addition to formic acid and ammonia, and treated at 50° C. for 3 minutes with gentle movement of the laminate.

After the benzimidazole treatment was completed, a buffer treatment was followed to more enhance the effects of the benzimidazole treatment. The copper clad laminate was washed with water, and then dipped in a copper ion-containing buffer solution at 50° C. for 2 minutes. The buffer solution used herein was an aqueous solution (pH 5.2) containing 0.1 g/l of cupric chloride in addition to formic acid and ammonia. The copper clad laminate was washed with water, and then dried at 140° C. for 10 minutes. The etching resist layer was thus obtained.

After formation of the etching resist layer, the resist layer-bearing laminate was treated with a 3% aqueous solution of sodium hydroxide to selectively remove the resist layer in non-circuit areas. As a result, the copper plating in the non-circuit areas of the laminate was fully exposed.

The copper clad laminate was etched with a alkali etchant (trade name "A process" commercially available from Mertec Co.) by guiding the laminate through a spray of the etchant at 50° C. for 120 seconds. The exposed copper plating was completely etched off. The laminate was dipped in a 5% aqueous solution of hydrochloric acid to remove the etching resist layer used as the masking means in the previous etching step. The copper through-hole printed wiring board was thus obtained. The wiring board was evaluated with regard to a finishing state thereof, and the results of the evaluation is summarized in the following Table 1. Note, the finishing state of the wiring boards was notably improved in comparison with that of Examples 1 and 2.

EXAMPLES 7 AND 8

Double sided copper clad laminate FR-4 having a thickness of 1.6 mm was drilled to bore a predetermined number of through-holes therein. Chemical copper plating and copper electroplating were subsequentially carried out to deposit a copper plating of 25 to 30 μm thickness onto an inner surface of each through-hole and both sides of the laminate. After formation of copper plating, a negative pattern of the resist was coated over the copper plating of the laminate in accordance with a printing process (Example 7) and photographic process (Example 8).

For Example 7, a resist ink containing acrylic acid and styrene copolymer as principal components thereof (trade name "KM-10" commercially available from Taiyo Ink Seizo KK) was printed over the copper plating of the laminate on a screen printing machine. The resulting negative pattern of the resist having a thickness of about 20 μm was then dried at 80° C. for 10 minutes.

For Example 8, a photosensitive dry film resist (trade name "A-225" commercially available from Fuji Hunt Co.) was superposed over the copper plating of the laminate, and then photographically exposed and developed. The resulting negative pattern of the resist having a thickness of 25 μm was then dried as in Example 7.

The resist pattern-bearing copper clad laminate was dipped in a 20% aqueous solution of sodium persulfate (persulfate etchant) to soft-etch a surface of the copper plating. After soft etching, the copper clad laminate was dipped in a 1% solution of benzimidazole compound, listed in the following Table 2, containing 0.5 g/l of cupric chloride in addition to formic acid and ammonia, and treated at 50° C. for 3 minutes with gentle movement of the laminate.

After the benzimidazole treatment was completed, a buffer treatment was followed to more enhance the effects of the benzimidazole treatment. The copper clad laminate was washed with water, and then dipped in a copper ion-containing buffer solution at 50° C. for 2 minutes. The buffer solution used herein was an aqueous solution (pH 5.2) containing 0.1 g/l of cupric chloride in addition to formic acid and ammonia. The copper clad laminated was washed with water, and then dried at 140° C. for 10 minutes. The etching resist layer was thus obtained.

After formation of the etching resist layer, the resist layer-bearing laminate was treated with a 3% aqueous solution of sodium hydroxide to selectively remove the resist layer in non-circuit areas. As a result, the copper plating in the non-circuit areas of the laminate was fully exposed.

The copper clad laminate was etched with a alkali etchant (trade name "A process" commercially available from Mertec Co.) by guiding the laminate through a spray of the etchant at 50° C. for 120 seconds. The exposed copper plating was completely etched off. The laminate was dipped in a 5% aqueous solution of hydrochloric acid to remove the etching resist layer used as the masking means in the previous etching step. The copper through-hole printed wiring board was thus obtained. The wiring board was evaluated with regard to a finishing state thereof, and the results of the evaluation is summarized in the following Table 2. Note, the finishing state of the wiring boards was notably improved in comparison with that of Example 3 and 4.

TABLE 1

| No. of benzimidazole compound | finishing state of Cu through-hole printed wiring board | |
|---|---|---|
| | Examples 1 & 2 with buffer treatment | Examples 5 & 6 without buffer treatment |
| BI 1 | good | excellent |
| BI 2 | good | excellent |
| BI 3 | good | excellent |
| BI 4 | good | excellent |
| BI 5 | good | excellent |
| BI 6 | good | excellent |
| BI 7 | good | excellent |
| BI 8 | good | excellent |
| BI 9 | good | excellent |
| BI 10 | good | excellent |
| BI 11 | good | excellent |
| BI 12 | good | excellent |
| BI 13 | good | excellent |
| BI 14 | good | excellent |
| BI 15 | good | excellent |
| BI 16 | good | excellent |
| BI 17 | good | excellent |
| BI 18 | good | excellent |
| BI 19 | good | excellent |
| BI 20 | good | excellent |
| BI 21 | good | excellent |
| BI 22 | good | excellent |
| BI 23 | good | excellent |
| BI 24 | good | excellent |
| BI 25 | good | excellent |
| BI 26 | good | excellent |
| BI 27 | good | excellent |
| BI 28 | good | excellent |
| BI 29 | good | excellent |
| BI 30 | good | excellent |
| BI 31 | good | excellent |
| BI 32 | good | excellent |
| BI 33 | good | excellent |
| BI 34 | good | excellent |
| BI 35 | good | excellent |
| BI 36 | good | excellent |
| BI 37 | good | excellent |
| BI 38 | good | excellent |
| BI 39 | good | excellent |
| BI 40 | good | excellent |
| BI 41 | good | excellent |
| BI 42 | good | excellent |
| BI 43 | good | excellent |
| BI 44 | good | excellent |
| BI 45 | good | excellent |
| BI 46 | good | excellent |
| BI 47 | good | excellent |
| BI 48 | good | excellent |
| BI 49 | good | excellent |
| BI 50 | good | excellent |
| BI 51 | good | excellent |
| BI 52 | good | excellent |
| BI 53 | good | excellent |

TABLE 2

| No. of benzimidazole compound | finishing state of Cu through-hole printed wiring board | |
|---|---|---|
| | Examples 3 & 4 with buffer treatment | Examples 7 & 8 without buffer treatment |
| BI 67 | good | excellent |
| BI 68 | good | excellent |
| BI 69 | good | excellent |
| BI 70 | good | excellent |
| BI 71 | good | excellent |
| BI 72 | good | excellent |
| BI 73 | good | excellent |
| BI 74 | good | excellent |
| BI 75 | good | excellent |
| BI 76 | good | excellent |
| BI 77 | good | excellent |
| BI 78 | good | excellent |
| BI 79 | good | excellent |
| BI 80 | good | excellent |
| BI 81 | good | excellent |
| BI 82 | good | excellent |
| BI 83 | good | excellent |
| BI 84 | good | excellent |
| BI 85 | good | excellent |
| BI 86 | good | excellent |
| BI 87 | good | excellent |

We claim:

1. A process for the production of printed wiring boards with copper through-holes, which process comprises the steps of:

forming a negative pattern of an alkaline aqueous solution-soluble resist on both sides of a copper clad laminate having through-holes previously drilled therein, in accordance with a printing process or photographic process;

dipping the resist pattern-bearing copper clad laminate in a bath of a solution providing an etching resist layer and containing at least one salt of a benzimidazole compound or derivatives thereof represented by the following formula (I):

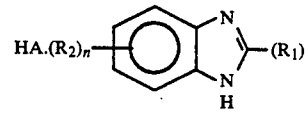

where $R_1$ is an alkyl group having 3 to carbon atoms, or an aryl group of the formula

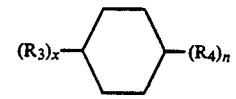

$R_2$ is an alkyl group having 1 to 6 carbon atoms,
$R_3$ is an alkyl group having 1 to 7 carbon atoms,
$R_4$ is an alkyl group having 1 to 6 carbon atoms,
n is an integer of 0 to 3,
x is 0 or 1, and
HA is an organic or inorganic acid, to thereby coat a surface of the copper plating of the laminate with an etching resist layer consisting of a copper complex of the benzimidazole compound of the formula (I);

drying the etching resist layer of the laminate;

bringing the laminate into contact with an alkaline aqueous solution, to thereby selectively remove the etching resist layer, and expose the copper plating in non-circuit areas of the laminate; and treating the laminate with an alkaline etchant to etch the exposed copper plating from the laminate.

2. The process according to claim 1, further comprising a step of dipping the etching resist layer-bearing copper clad laminate in a buffer solution containing copper ions, after a formation of the etching resist layer and before a selective removal of same.

3. The process according to claim 1 or 2, in which the negative resist pattern is formed from an alkaline aqueous solution-soluble resist ink.

4. The process according to claim 1 or 2, in which the negative resist pattern is formed from an alkali-developable liquid resist.

5. The process according to claim 1 or 2, in which the negative resist pattern is formed from an alkali-developable photosensitive resist film.

6. The process according to claim 1 or 2, in which the benzimidazole compound represented by formula (I) is selected from the group consisting of 2-n-propyl-benzimidazole, 2-n-propyl-methylbenzimidazole, 2-n-propyl-dimethylbenzimidazole, 2-n-butyl-dibenzimidazole, 2-n-butyl-methylbenzimidazole, 2-n-butyl-dimethylbenzimidazole, 2-n-pentyl-benzimidazole, 2-n-pentyl-methylbenzimidazole, 2-n-pentyl-dimethylbenzimidazole, 2-n-hexyl-benzimidazole, 2-n-hexyl-methylbenzimidazole, 2-n-hexyl-dimethylbenzimidazole, 2-n-heptyl-benzimidazole, 2-n-heptyl-methylbenzimidazole, 2-n-heptyl-dimethylbenzimidazole, 2-n-octyl-benzimidazole, 2-n-octyl-methylbenzimidazole, 2-n-octyl-dimethylbenzimidazole, 2-n-nonyl-benzimidazole, 2-n-nonyl-methylbenzimidazole, 2-n-nonyl-dimethylbenzimidazole, 2-n-decyl-benzimidazole, 2-n-decyl-methylbenzimidazole, 2-n-decyl-dimethylbenzimidazole, 2-n-undecyl-benzimidazole, 2-n-undecyl-methylbenzimidazole, 2-n-undecyl-dimethylbenzimidazole, 2-n-dodecyl-benzimidazole, 2-n-dodecyl-methylbenzimidazole, 2-n-dodecyl-dimethylbenzimidazole, 2-n-tridecyl-benzimidazole, 2-n-tridecyl-methylbenzimidazole, 2-n-tridecyl-dimethylbenzimidazole, 2-n-tetradecyl-benzimidazole, 2-n-tetradecylmethylbenzimidazole, 2-n-tetracecyl-dimethylbenzimidazole, 2-n-pentadecyl-benzimidazole, 2-n-pentadecyl-methylbenzimidazole, 2-n-pentadecyl-dimethylbenzimidazole, 2-n-hexadecyl-benzimidazole, 2-n-hexadecyl-methylbenzimidazole, 2-n-hexadecyldimethylbenzimidazole, 2-n-heptadecyl-benzimidazole, 2-n-heptadecyl-methylbenzimidazole, 2-n-heptadecyl-dimethylbenzimidazole, 2-isopropyl-benzimidazole, 2-isopropyl-methylbenzimidazole, 2-isopropyl-dimethylbenzimidazole, 2-isobutyl-benzimidazole, 2-isobutyl-methylbenzimidazole, 2-isobutyl-dimethylbenzimidazole, 2-isopentyl-benzimidazole, 2-isopentyl-methylbenzimidazole, 2-isopentyl-dimethylbenzimidazole, 2-isohexylbenzimidazole, 2-isohexyl-methylbenzimidazole, 2-isohexyldimethylbenzimidazole, 2-neopentyl-benzimidazole, 2-neopentylmethylbenzimidazole, 2-neopentyl-dimethylbenzimidazole, 2-sec.-butyl-benzimidazole, 2-sec.-butyl-methylbenzimidazole, 2-sec.-butyl-dimethylbenzimidazole, 2-tert.-butyl-benzimidazole, 2-tert.-butyl-methylbenzimidazole, and 2-tert.-butyl-dimethylbenzimidazole, 2-penyl-benzimidazole, 2-phenyl-methylbenzimidazole, 2-phenyl-dimethylbenzimidazole, 2-tosyl-benzimidazole, 2-tosyl-methylbenzimidazole, 2-tosyl-dimethylbenzimidazole, 2-xylyl-benzimidazole, 2-xylyl-methylbenzimidazole, 2-xylyldimethylbenzimidazole, 2-mesityl-benzimidazole, 2-mesitylmethylbenzimidazole, 2-mesityl-dimethylbenzimidazole, 2-tert.-phenyl-benzimidazole, 2-tert.-phenyl-methylbenzimidazole, and 2-tert.-phenyl-dimethylbenzimidazole 7. The process according to claim 1 or 2, in which the benzimidazole compound represented by the formula (I) or (II) is used in an amount of 0.01 to 40% in the solution providing an etching resist layer.

8. The process according to claim 1 or 2, in which the copper clad laminate is dipped in a bath of the solution providing an etching resist layer at a bath temperature of 40° to 50° C. for 1 to 3 minutes.

9. The process according to claim 2, in which the copper ion-containing buffer solution contains at least one base selected from the group consisting of ammonia, dimethylamine, triethylamine, diethanol amine, triethanolamine, monoethanolamine, dimethylethanolamine, diethylethanolamine, isopropylethanolamine, sodium hydroxide and potassium hydroxide, and at least one copper compound selected from the group consisting of copper (II) acetate, copper (II) sulfate, cuprous chloride, cupric chloride, copper hydroxide, copper oxide, cuprous oxide, cupric oxide, copper (II) phosphate and copper (I) carbonate.

10. The process according to claim 2 or 9, in which the concentration of the copper ion in the buffer solution is 50 to 150 ppm.

11. The process according to claim 2 or 9, in which the buffer treatment is carried out at a bath temperature of 30° to 50° C. for 1 to 3 minutes.

* * * * *

UNITED STATES PATENT AND TRADEMARK OFFICE
CERTIFICATE OF CORRECTION

PATENT NO. : 5,275,694
DATED : January 4, 1994
INVENTOR(S) : Hideaki Yamagushi, Hideyuki Kawai, Daikichi Tachibana, Kenichi Yamaguchi It is certified that error appears in the above-indentified patent and that said Letters Patent is hereby corrected as shown below:

In Column 11, Table 1, insert examples BI54-BI66 following example BI53 at line 60, as follows:

| | | |
|---|---|---|
| BI54 | good | excellent |
| BI55 | good | excellent |
| BI56 | good | excellent |
| BI57 | good | excellent |
| BI58 | good | excellent |
| BI59 | good | excellent |
| BI60 | good | excellent |
| BI61 | good | excellent |
| BI62 | good | excellent |
| BI63 | good | excellent |
| BI64 | good | excellent |
| BI65 | good | excellent |
| BI66 | good | excellent |

UNITED STATES PATENT AND TRADEMARK OFFICE
CERTIFICATE OF CORRECTION

PATENT NO. : 5,275,694
DATED : January 4, 1994
INVENTOR(S) : Hideaki Yamahushi, Hideyuki Kawai, Daikichi Tachibana, Kenichi Yamaguchi It is certified that error appears in the above-indentified patent and that said Letters Patent is hereby corrected as shown below:

Column 12, line 1 should read --3 to 17 carbon atoms--.

Signed and Sealed this

Sixteenth Day of August, 1994

Attest:

BRUCE LEHMAN

Attesting Officer      Commissioner of Patents and Trademarks